(12) United States Patent
Mednik et al.

(10) Patent No.: US 9,590,613 B2
(45) Date of Patent: Mar. 7, 2017

(54) CIRCUIT AND METHOD FOR ACTIVE CROSSTALK REDUCTION IN MULTIPLE-CHANNEL POWER SUPPLY CONTROLLERS

(71) Applicant: Microchip Technology Inc., Chandler, AZ (US)

(72) Inventors: Alexander Mednik, Campbell, CA (US); Rohit Tirumala, Sunnyvale, CA (US); Marc Tan, Sunnyvale, CA (US); Simon Krugly, San Jose, CA (US)

(73) Assignee: Microchip Technology Inc., Chandler, AZ (US)

( * ) Notice: Subject to any disclaimer, the term of this patent is extended or adjusted under 35 U.S.C. 154(b) by 10 days.

(21) Appl. No.: 14/742,571

(22) Filed: Jun. 17, 2015

(65) Prior Publication Data

US 2015/0372594 A1 Dec. 24, 2015

Related U.S. Application Data

(60) Provisional application No. 62/015,944, filed on Jun. 23, 2014.

(51) Int. Cl.
 *G05F 1/00* (2006.01)
 *H03K 17/16* (2006.01)
 *H02M 3/158* (2006.01)
 *H02M 1/08* (2006.01)

(52) U.S. Cl.
 CPC ............ *H03K 17/162* (2013.01); *H02M 1/08* (2013.01); *H02M 3/1584* (2013.01); *H02M 2003/1586* (2013.01)

(58) Field of Classification Search
 CPC .. Y02B 70/126; H02M 3/156; H02M 3/1584; H02J 1/102
 USPC ................ 323/207, 222, 272, 271, 282–283; 363/65, 89
 See application file for complete search history.

(56) References Cited

U.S. PATENT DOCUMENTS

| 7,151,681 | B2 | 12/2006 | Yang et al. | |
| 8,330,441 | B1 | 12/2012 | Klumpp et al. | |
| 2005/0280404 | A1 | 12/2005 | LeFevre et al. | |
| 2011/0037443 | A1* | 2/2011 | Yang ................... | H02M 1/4225 323/207 |
| 2011/0049986 | A1 | 3/2011 | Edelson et al. | |
| 2012/0001600 | A1* | 1/2012 | Yang ................... | H02M 1/4225 323/207 |
| 2014/0226372 | A1* | 8/2014 | Tang ................. | H02M 3/33523 363/21.18 |

FOREIGN PATENT DOCUMENTS

| TW | 583821 | 4/2004 |
| TW | I379501 | 12/2012 |
| TW | I398748 | 6/2013 |

* cited by examiner

*Primary Examiner* — Nguyen Tran
(74) *Attorney, Agent, or Firm* — DLA Piper LLP (US)

(57) ABSTRACT

A comparator sense input is disconnected from a current sense resistor for the duration of a switching transition in an adjacent channel(s). Instead, the sense input receives a signal of the magnitude and the slew rate sampled prior to the transition.

10 Claims, 5 Drawing Sheets

US 9,590,613 B2

CIRCUIT AND METHOD FOR ACTIVE CROSSTALK REDUCTION IN MULTIPLE-CHANNEL POWER SUPPLY CONTROLLERS

CROSS REFERENCE TO RELATED APPLICATION

This patent application claims priority to U.S. Provisional Application No. 62/015,944, filed on Jun. 23, 2014, and titled "Circuit and Method for Active Crosstalk Reduction in Multiple-Channel Power Supply Controllers," which is incorporated herein by reference in its entirety.

TECHNICAL FIELD

A circuit and method are provided for reducing crosstalk in a multiple channel switching power supply controller.

BACKGROUND OF THE INVENTION

Power supply control integrated circuits, especially those using current sense comparators, and even more so the ones for controlling power supplies in continuous conduction mode (CCM), are prone to false-triggering due to noise from adjacent switching circuits. Including two or more such controllers within one integrated circuit (IC) is problematic due to noise coupling and ground disturbances caused by an adjacent channel. A sub-optimal PCB layout can cause significant crosstalk in such multi-channel IC.

FIG. 1 depicts a prior art multi-channel peak current-mode control (CMC) IC 299 for driving a plurality of switching power converters 100. Each power converter 100 comprises a power inductor 101 operating in continuous conduction mode (CCM) or discontinuous conduction mode (DCM), a control switch 102 having a control gate input, a current sense resistor 104 for sensing current in the control switch 102, a freewheel diode 103 providing a path for the inductor 101 current when the switch 102 is off. The IC 299 comprises multiple peak CMC controllers 200, having an input for receiving current sense signal from the resistor 104, a driver output for controlling the gate input of the switch 102. Each controller 200 includes a comparator 201 having: an input for receiving current sense signal from the resistor 104; a reference input for receiving a reference voltage REF; and an output changing its level when the current sense signal 104 exceeds the reference REF. Each controller 200 also includes: a flip-flop circuit having an output Q for controlling the gate of the switch 102, a set input S for receiving a clock signal CLK, and a reset input R for receiving the output of the comparator 201.

FIG. 2 shows typical CCM waveforms 501 and 502 received at current sense inputs of the prior art IC 299 depicted in FIG. 1 from two resistors 104. With reference to waveform 501, in normal operation, the driver output turns the switch 102 off when the voltage at the corresponding resistor 104 exceeds REF. The switch 102 is turned on again when the clock signal CLK is received. However, with reference to waveform 502, switching transitions of the switch 102 generate disturbance 599 of current sense voltage 104 received by the adjacent controllers 200. This disturbance can cause false detection of the level REF, and the conduction cycle of the switch 104 can be terminated prematurely.

A method and a circuit are needed to eliminate these cross-coupling effects in a multi-channel power supply peak current-mode control IC, or any other type of power supply control ICs employing a current sense comparator 201.

SUMMARY OF THE INVENTION

A comparator sense input is disconnected from a current sense resistor for the duration of a switching transition in an adjacent channel(s). Instead, the sense input receives a signal of the magnitude and the slew rate sampled prior to the transition.

DETAILED DESCRIPTION OF THE PREFERRED EMBODIMENT

Figure 1:
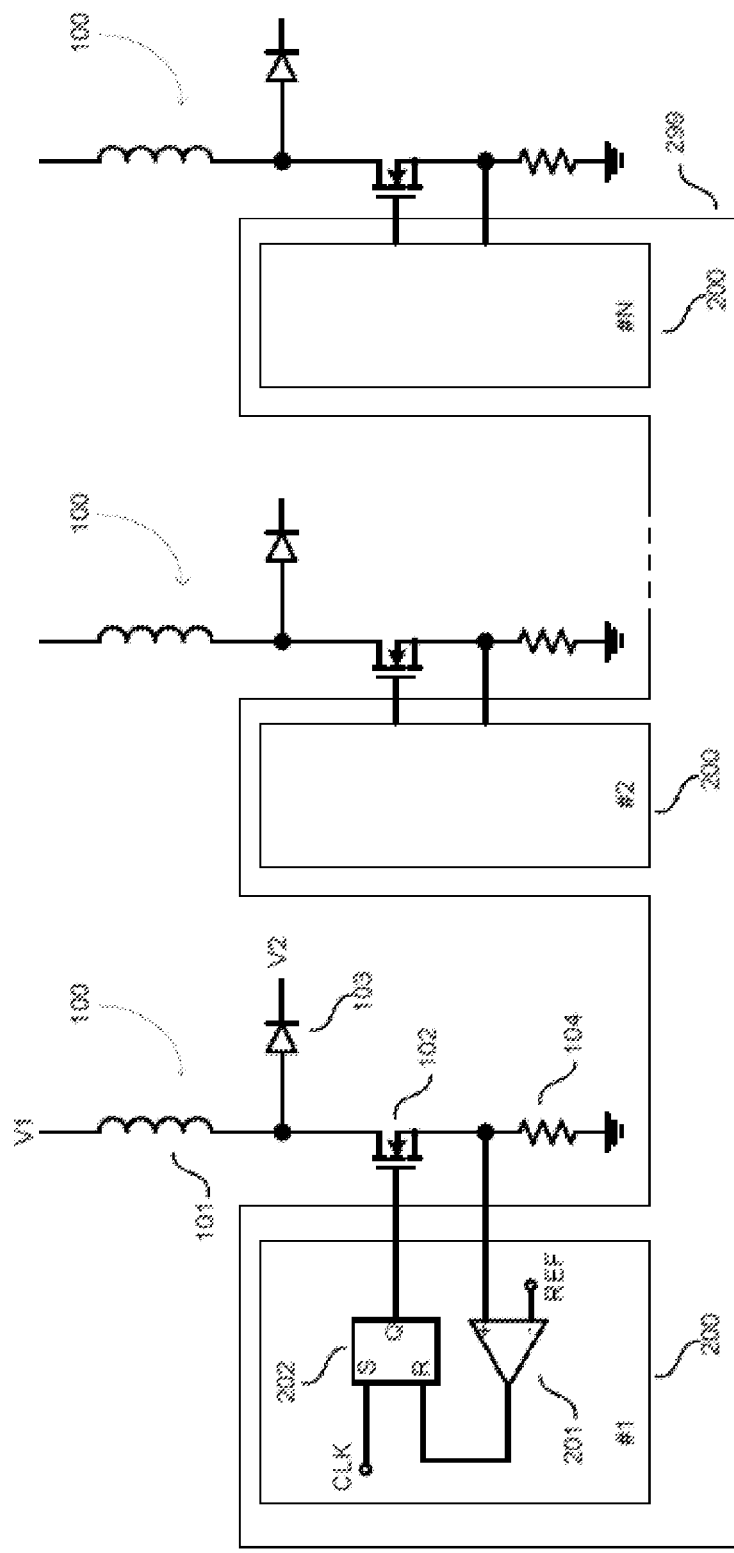
FIG. 1 depicts a prior art multi-channel peak current-mode control integrated circuit for driving a plurality of switching power converters.
Figure 2:
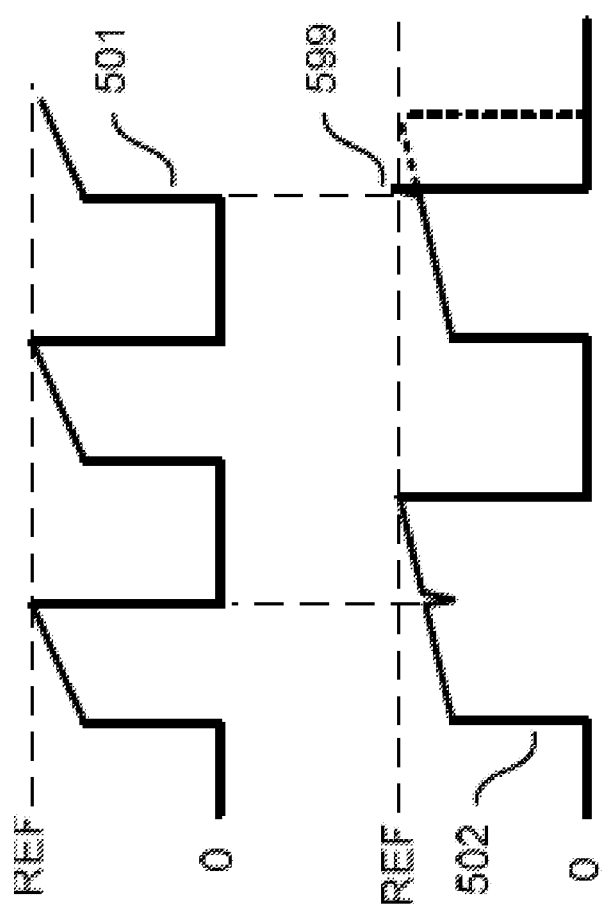
FIG. 2 depicts typical continuous conduction mode waveforms received at current sense inputs of the prior art integrated circuit depicted in FIG. 1.
Figure 3:
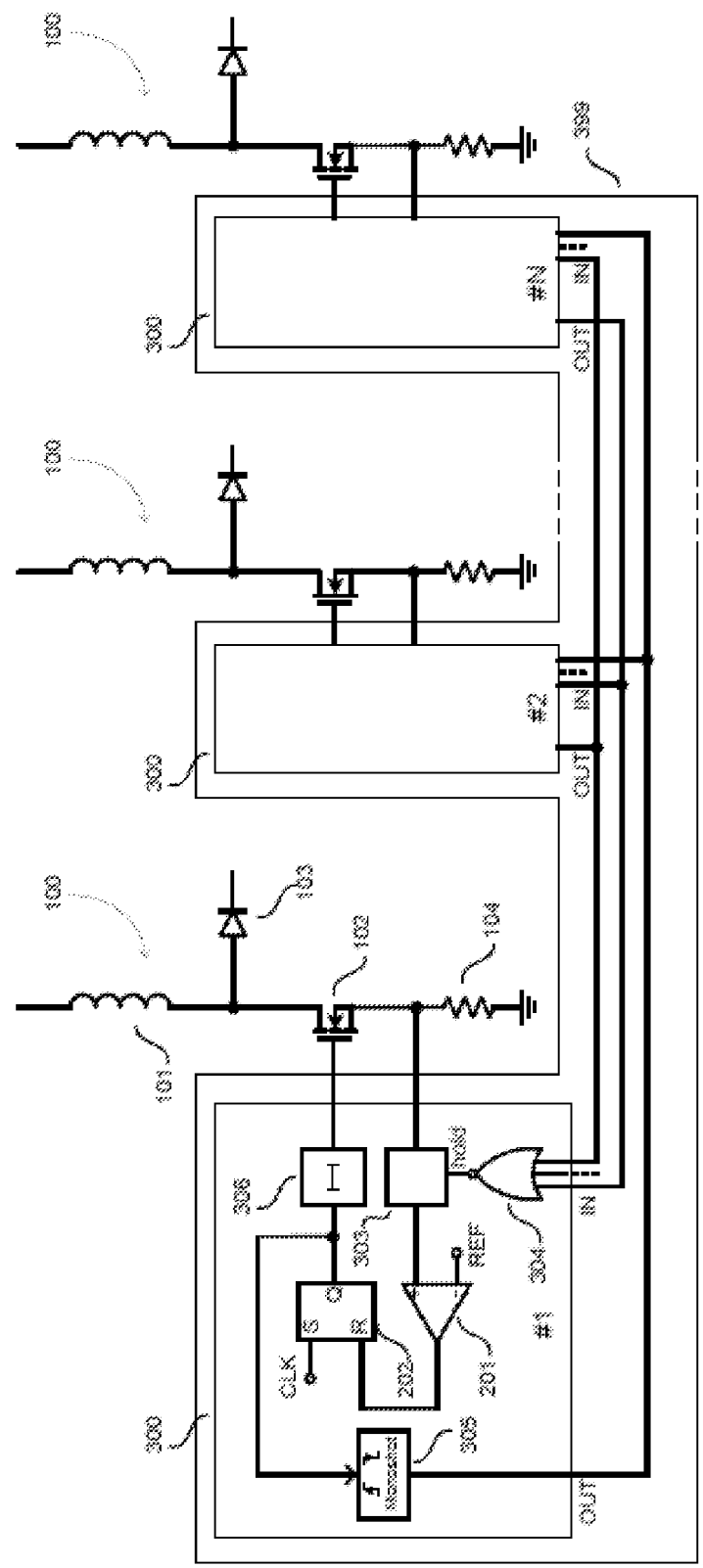
FIG. 3 depicts an embodiment of a multi-channel integrated circuit for driving a plurality of switching power converters.

FIG. 3 depicts a multi-channel integrated circuit 399 of the present invention for driving a plurality of switching power converters 100. The IC 399 comprises multiple peak CMC controllers 300, having an input for receiving current sense signal from the resistor 104, a driver output for controlling the gate input of the switch 102. In addition to the controller 200 elements of FIG. 1, the controller 300 also comprises: a track-and-hold circuit 303 having an input for receiving the current sense voltage from the resistor 104, having an output coupled to the current sense input of the comparator 201, and having a control input 'hold'; a blanking pulse generator 305 having an input coupled to the flip-flop 202 output for detecting its rising and falling edges, and having an output for generating a blanking pulse synchronized with these edges; a gate 304 having multiple inputs for receiving the blanking pulses 305 from the adjacent controllers 300, and having an output for controlling the track-and-hold circuit 303. The controller 300 may also comprise a delay 306 for delaying the gate driver output with respect to the blanking pulse 305. An inherent driver delay between the output Q and the gate of the switch 102 may be utilized as the delay 306.

In operation, the track-and-hold circuit 303 tracks the level and the slew rate of the current sense voltage at 104 while propagating this voltage to the input of the current sense comparator 201. The track-and hold circuit 303 disconnects its input from the resistor 104 and replicates the voltage level and slew rate sampled at the resistor 104 extrapolating this voltage for the duration of a blanking pulse 305 received at any of the inputs of the gate 304.

Figure 4:
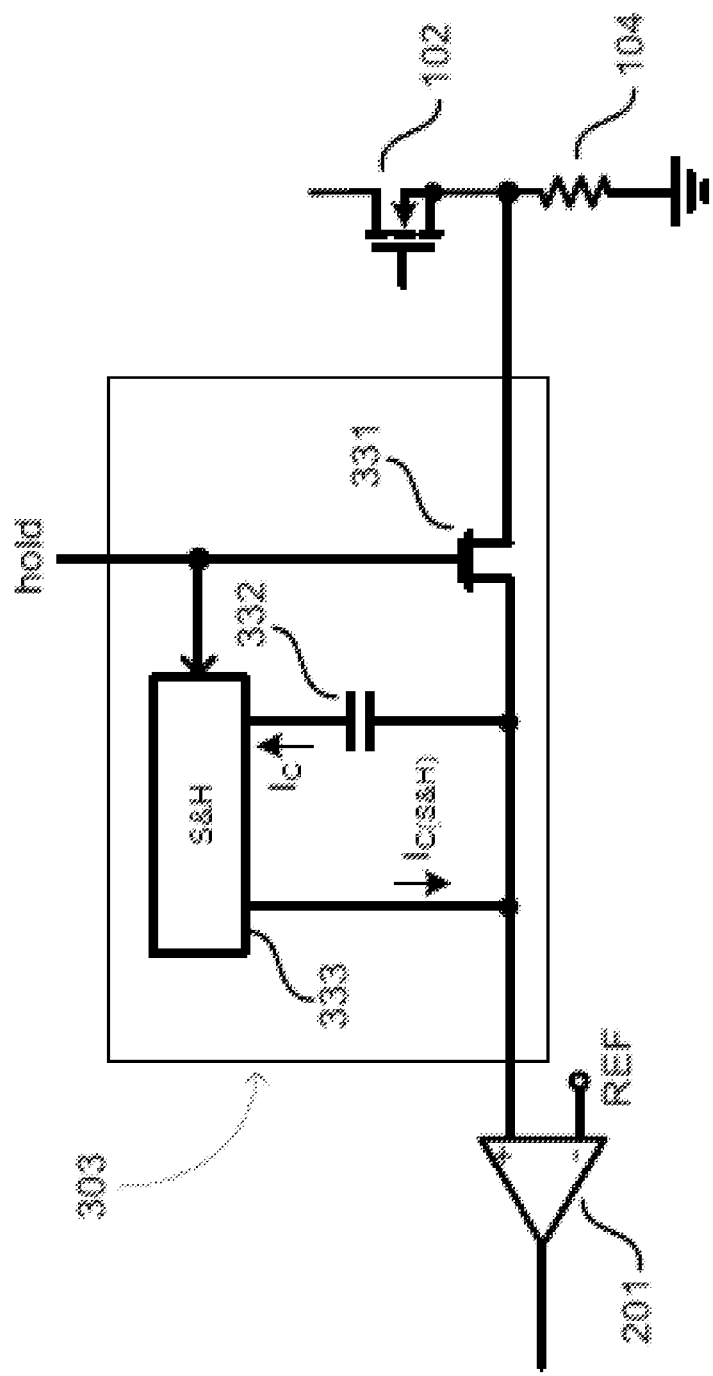
FIG. 4 depicts an embodiment of a track-and-hold circuit for use in the circuit of FIG. 3.

FIG. 4 depicts one embodiment of the track-and hold circuit 303 shown in FIG. 3, comprising: a blanking switch 331 coupled between the resistor 104 and the current sense input of the comparator 201, having its control gate coupled to the 'hold' input; a sense capacitor 332 coupled to the switch 331 for sensing the voltage level and voltage slew rate at the resistor 104 while the switch 331 is in conduction, and for extrapolating the sampled voltage and slew rate at its plate while the switch 331 is off; a track-and-hold current mirror circuit 333 having a control input wired to the 'hold' input for sampling displacement current in the capacitor 332 and replicating this current at the plate of the capacitor 332 when the switch 331 is off.

Figure 5:
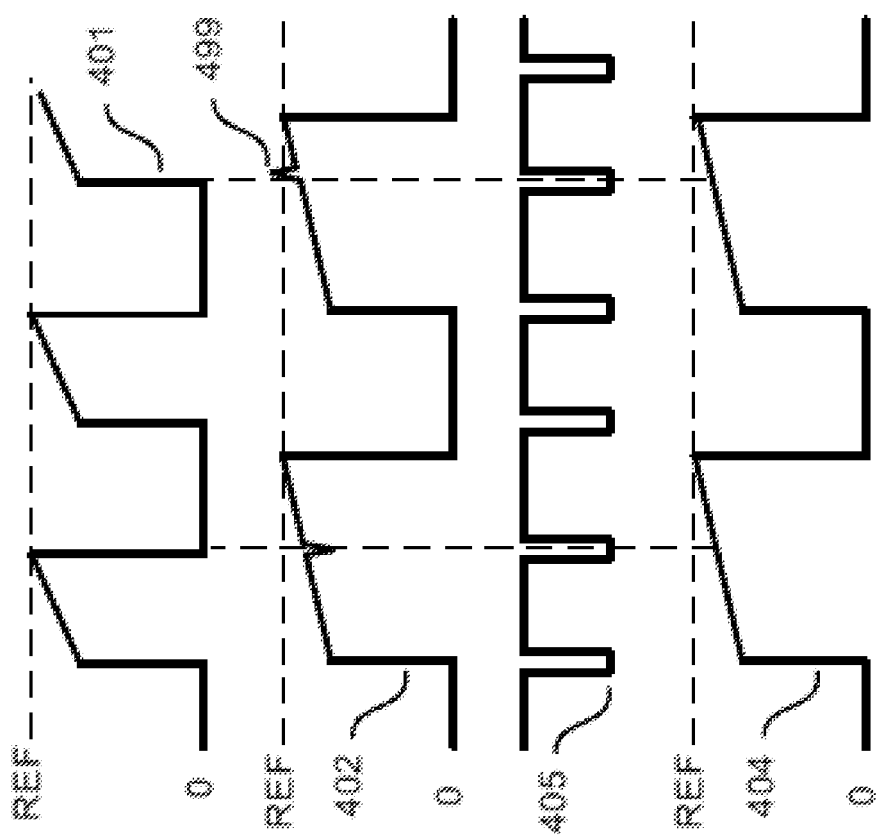
FIG. 5 shows typical waveforms observed with the circuit of FIG. 3

FIG. 5 shows typical waveforms observed with the a multi-channel integrated circuit 399 depicted in FIG. 3. Waveforms 401 and 402 represent current sense voltage at the resistor 104 of any two power converters 100. Waveform 405 shows the blanking pulses produced by the pulse generator 305. Waveform 404 represents current sense input voltage of the comparator 301 showing the disturbance 499 replaced by an undisturbed slope generated by the track-and-hold circuit 303 within the blanking pulses 405.

In the embodiments described above, the present invention provides a method for reducing crosstalk between channels in a multiple-channel power supply control IC incorporating current sense comparators, the method comprising: sampling and holding a current sense voltage and its first derivative monitored at a current sense element; and replacing the instantaneous current sense voltage by its linear extrapolation derived from the sampled current sense voltage and the sampled first derivative.

What is claimed is:

1. An integrated circuit comprising at least two current-mode controllers for driving at least two switching power converters, each converter including a control switch and a current sense element, each current-mode controller comprising:
   a control output for controlling the control switch;
   a current sense input for receiving current sense voltage from the current sense element; and
   a track-and-hold circuit comprising an input for receiving the current sense voltage from the current sense input, a control input, and an output for replicating magnitude and slew rate of the current sense voltage when the control input is activated; and
   a circuit for outputting and activating the control input upon receiving as one or more inputs an asserted signal from one or more adjacent current-mode controllers, thereby reducing cross-talk from the one or more adjacent current-mode controllers.

2. The integrated circuit of claim 1, further comprising a blanking pulse generator for receiving the control output and for generating a blanking output coupled to the control input of the track-and-hold circuit of at least one adjacent current-mode controller, wherein the blanking output pulses are synchronized with transitions of the control output.

3. An integrated circuit comprising at least two current-mode controllers for driving at least two switching power converters, each converter including a control switch and a current sense element, each current-mode controller comprising:
   a control output for controlling the control switch;
   a current sense input for receiving current sense voltage from the current sense element;
   a track-and-hold circuit comprising an input for receiving the current sense voltage from the current sense input, a control input, and an output for replicating magnitude and slew rate of the current sense voltage when the control input is activated;
   a blanking pulse generator for receiving the control output and for generating a blanking output coupled to the control input of the track-and-hold circuit of at least one adjacent current-mode controller, wherein the blanking output pulses are synchronized with transitions of the control output; and
   a logic gate having at least one input for receiving the blanking pulse generator outputs from one or more adjacent current-mode controllers and an output for generating a hold pulse coupled to the control input of the track-and-hold circuit, wherein the hold pulse is generated every time a blanking pulse from an adjacent current-mode controller is received.

4. The integrated circuit of claim 1, further comprising a comparator including:
   a first input for receiving the output of the track-and-hold circuit;
   a second input for receiving a reference voltage; and
   an output issuing an active state when the output of the track-and-hold circuit exceeds the reference voltage.

5. The integrated circuit of claim 4, further comprising a flip-flop having an output, a set input, and a reset input, wherein:
   the output of the flip-flop is coupled to the control output for controlling the control switch;
   the output of the flip-flop is activated upon receiving an external clock signal at the set input; and
   the output of the flip-flop is deactivated upon receiving the active output state from the comparator at the reset input.

6. The integrated circuit of claim 5, further comprising:
   a circuit for receiving the output of the flip-flop and for providing a delayed version of the output of the flip-flop to the control switch for the switching power converter.

7. The integrated circuit of claim 4, wherein the track-and-hold circuit comprises:
   a blanking switch having an input, an output, and a gate terminals, wherein the input terminal is coupled to the current sense input, the output terminal is coupled to the first input of the comparator, and the gate terminal is adapted to receive the control input of the track-and-hold circuit, and wherein the blanking switch is off for the duration of the blanking pulse received at the control input;
   a sense capacitor coupled to the output terminal of the blanking switch; and
   a track-and-hold current mirror circuit for tracking displacement current in the sense capacitor and replicating the displacement current at the output terminal of the blanking switch when the blanking switch is off.

8. A method of controlling a plurality of switching power converters, each power converter comprising an inductor, a control switch, and a current sense element, the method comprising steps of:
   tracking a voltage level and voltage slew rate at the current sense element in an individual switching power converter;
   storing the voltage level and voltage slew rate preceding switching transitions of the control switch in an adjacent switching power converter; and
   substituting the sense voltage with its replica reconstructed from the stored voltage level and voltage slew rate for periods of the switching transitions, thereby reducing cross-talk between two or more of the plurality of switching power converters.

9. The method of claim 8, wherein the switching power converter also comprises a sense capacitor, and wherein:
   the magnitude is obtained as voltage potential at a plate of the sense capacitor; and the temporal derivative is obtained as displacement current in the sense capacitor.

10. The method of claim 9, wherein the sense voltage is reconstructed by steps of:
   disconnecting the sense capacitor from the current sense element for the periods of switching transitions in an adjacent switching power converter; and
   feeding the stored displacement current back into the sense capacitor.

* * * * *